(12) United States Patent
Lan et al.

(10) Patent No.: US 10,535,796 B2
(45) Date of Patent: Jan. 14, 2020

(54) SEMICONDUCTOR LIGHT EMITTING DEVICE

(71) Applicant: Xiamen San'An Optoelectronics Co., Ltd., Fujian (CN)

(72) Inventors: Yung-Ling Lan, Anhui (CN); Chan-Chan Ling, Anhui (CN); Chi-Ming Tsai, Anhui (CN); Chia-Hung Chang, Anhui (CN)

(73) Assignee: XIAMEN SAN'AN OPTOELECTRONICS CO., LTD., Fujian (CN)

( * ) Notice: Subject to any disclaimer, the term of this patent is extended or adjusted under 35 U.S.C. 154(b) by 0 days.

(21) Appl. No.: 16/426,016

(22) Filed: May 30, 2019

(65) Prior Publication Data
US 2019/0280155 A1 Sep. 12, 2019

Related U.S. Application Data

(63) Continuation-in-part of application No. PCT/CN2018/078654, filed on Mar. 12, 2018.

(30) Foreign Application Priority Data

Jul. 31, 2017 (CN) .......................... 2017 1 0638217

(51) Int. Cl.
H01L 33/06 (2010.01)
H01L 33/32 (2010.01)
H01L 33/00 (2010.01)

(52) U.S. Cl.
CPC .......... H01L 33/06 (2013.01); H01L 33/0075 (2013.01); H01L 33/32 (2013.01)

(58) Field of Classification Search
None
See application file for complete search history.

(56) References Cited

U.S. PATENT DOCUMENTS

2008/0095492 A1  4/2008 Son et al.
2010/0219395 A1* 9/2010 Hirayama ............... H01L 33/06
                                                    257/13
(Continued)

FOREIGN PATENT DOCUMENTS

CN  102931303 A   2/2013
CN  107394019 A   11/2017
WO  2017057149 A1  4/2017

OTHER PUBLICATIONS

Li, Luping, et al. "On the Hole Injection for III-Nitride Based Deep Ultraviolet Light-Emitting Diodes." Materials, vol. 10, No. 10, 2017, p. 1221., doi:10.3390/ma10101221. (Year: 2017).*

(Continued)

Primary Examiner — J. E. Schoenholtz
(74) Attorney, Agent, or Firm — Thomas | Horstemeyer, LLP

(57) ABSTRACT

A semiconductor light emitting device includes a multi-quantum-well structure, a first potential barrier layer, a first capping layer, a second capping layer, and an electron barrier layer stacked in order on a growth substrate. The multi-quantum-well structure includes a plurality of alternately-stacked second potential barrier layers and potential well layers. The first capping layer is an undoped semiconductor layer and the second capping layer is a p-doped semiconductor layer. Each of the first and second capping layers has a band gap larger than that of each of the second potential barrier layers and the electron barrier layer. A method of preparing the semiconductor light emitting device is also provided.

17 Claims, 2 Drawing Sheets

(56) References Cited

U.S. PATENT DOCUMENTS

| | | | |
|---|---|---|---|
| 2014/0367715 A1 | 12/2014 | Hong | |
| 2017/0110852 A1* | 4/2017 | Mino | H01L 33/02 |
| 2018/0287014 A1* | 10/2018 | Asada | H01L 33/06 |
| 2019/0006558 A1* | 1/2019 | Watanabe | H01L 33/06 |

OTHER PUBLICATIONS

Search Report issued to PCT application No. PCT/CN2018/078654 by the CNIPA dated Jun. 19, 2018.
Search Report appended to an Office Action, which was issued to Chinese counterpart application No. 201710638217.9 by the CNIPA dated Dec. 5, 2018, with an English translation thereof.

\* cited by examiner

SEMICONDUCTOR LIGHT EMITTING DEVICE

CROSS-REFERENCE TO RELATED APPLICATION

This application is a continuation-in-part (CIP) of International Application No. PCT/CN2018/078654, filed on Mar. 12, 2018, which claims priority to Chinese Invention Patent Application No. 201710638217.9, filed on Jul. 31, 2017.

FIELD

The disclosure relates to a semiconductor device, more particularly to a semiconductor light emitting device and a method for preparing the same.

BACKGROUND

A gallium nitride (GaN)-based light emitting diode (LED) includes a p-type semiconductor layer providing electron holes and an n-type semiconductor layer providing electrons, having between them a P-N junction that converts electrical energy to luminous energy. When electric current passes through the LED in the forward direction, the electrons provided by the n-type semiconductor layer recombines with the electron holes in the p-type semiconductor layer, releasing energy corresponding to the band gap between the conduction band and the valence band. The energy released may either be thermal energy or light and the light may be emitted outwards.

However, when epitaxially growing the p-type semiconductor layer, growth conditions such as the growth temperature may cause a p-type dopant (e.g. magnesium) to spread to a quantum well structure, thus negatively affecting the material quality of a potential well layer in the quantum well structure. This may, in turn, lower the luminous efficiency of the LED.

SUMMARY

Therefore, the object of the disclosure is to provide a semiconductor light emitting device that can alleviate the drawback of the prior art. A method of preparing the semiconductor light emitting device is also provided.

According to one aspect of the disclosure, a semiconductor light emitting device includes a growth substrate, and an n-type semiconductor layer, a multi-quantum-well structure, a first potential barrier layer, a first capping layer, a second capping layer, an electron barrier layer, a p-type semiconductor layer, and a p-type contact layer stacked in order on the growth substrate.

The multi-quantum-well structure includes a plurality of alternately-stacked second potential barrier layers and potential well layers.

The first capping layer is an undoped semiconductor layer and the second capping layer is a p-doped semiconductor layer. Each of the first and second capping layers has a band gap larger than that of each of the second potential barrier layers and the electron barrier layer.

According to another aspect of the disclosure, a method of preparing a semiconductor light emitting device includes:

growing an n-type semiconductor layer on a growth substrate;

growing a multi-quantum-well structure on the n-type semiconductor layer;

growing a first potential barrier layer on the multi-quantum-well structure;

growing sequentially first and second capping layers on top of the first potential barrier layer; and growing sequentially an electron barrier layer, a p-type semiconductor layer and a p-type contact layer on the second capping layer.

The multi-quantum-well structure includes a plurality of alternately stacked second potential barrier layers and potential well layers. The first capping layer is an undoped layer having a growth temperature between that of the second potential barrier layers and that of the potential well layers. The second capping layer is a p-doped layer having a growth temperature lower than that of the potential well layers. Each of the first and second capping layers has a band gap larger than that of each of the second potential barrier layers and the electron barrier layer.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
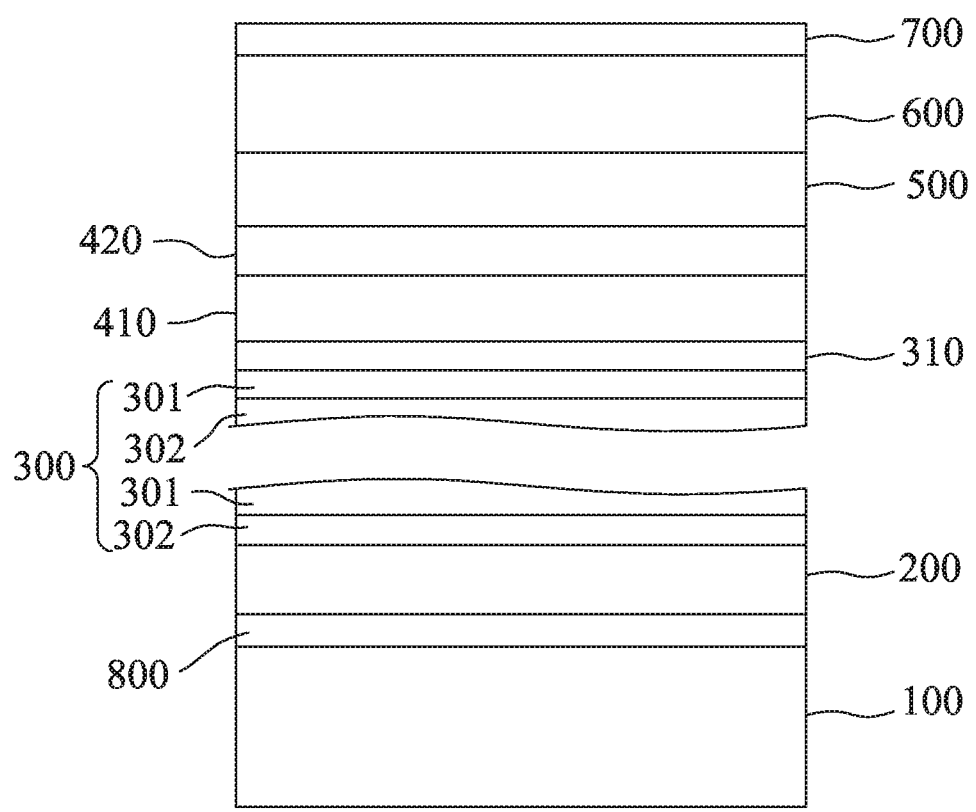
FIG. 1 is a fragmentary schematic sectional view of an embodiment of a semiconductor light emitting device according to the disclosure.

Referring to FIG. 1, an embodiment of a semiconductor light emitting device according to the disclosure includes a growth substrate 100, and an n-type semiconductor layer 200, a multi-quantum-well structure 300, a first potential barrier layer 310, a first capping layer 410, a second capping layer 420, an electron barrier layer 500, a p-type semiconductor layer 600, and a p-type contact layer 700 stacked in order on the growth substrate 100.

The growth substrate 100 may be made of one of sapphire, GaN, and silicon, but is not limited in this respect.

In certain embodiments, in order to reduce the strain caused by lattice mismatch between the growth substrate 100 and the n-type semiconductor layer 200, the semiconductor light emitting device may further includes a buffer layer 800 formed between the n-type semiconductor layer 200 and the growth substrate 100. The buffer layer may be made from a material with the formula of $Al_{1-x}Ga_xIn_yN$, wherein $0 \leq x \leq 1$ and $0 \leq y < 1$. Specifically, the material for making the buffer layer is selected from the group consisting of aluminum nitride (AlN), GaN, aluminum gallium nitride (AlGaN), aluminum indium gallium nitride (AlInGaN), indium nitride (InN), indium gallium nitride (InGaN) and combinations thereof.

The multi-quantum-well structure 300 includes a plurality of alternately-stacked second potential barrier layers 301 and potential well layers 302. The repetition period of a combination of one of the second potential barriers and one of the potential well layers 302 of the multi-quantum-well structure 300 is between 3 and 20. The band gap of each of the second potential barrier layers 301 is larger than that of each of the potential well layers 302. Each of the second potential barrier layers 301 is one of an undoped semiconductor layer and an n-doped semiconductor layer.

The first potential barrier layer 310 is an undoped semiconductor layer having one of a single-layered structure and a multi-layered structure. In certain embodiments, the first potential barrier layer 310 may be an undoped GaN (u-GaN) layer, an undoped AlGaN (u-AlGaN) layer, a u-GaN/u-AlGaN multi-layered structure, or an undoped InGaN/undoped AlInGaN/u-AlGaN multi-layered structure.

The first capping layer 410 is an undoped semiconductor layer for reducing the spreading of p-type doping material to the multi-quantum-well structure 300 which may cause a reduction of the luminous efficiency of the semiconductor light emitting device. In certain embodiments, the first capping layer 410 is an undoped AlN (u-AlN) layer.

The second capping layer 420 is a p-doped semiconductor layer. The second capping layer 420 has a p-type doping concentration higher than that of the p-type semiconductor layer 600 and lower than that of the p-type contact layer 700. The high level of p-type doping increases electron hole injection effect and allows the second capping layer 420 to act as a hole injection layer. Specifically, the second capping layer 420 has a p-type doping concentrating between $1 \times 10^{19}$ $cm^{-3}$ and $1 \times 10^{20}$ $cm^{-3}$. In certain embodiments, the second capping layer 420 is a p-doped AlN (p-AlN) layer. The second capping layer 420 has a thickness less than that of each of the potential well layers 302 of the multi-quantum-well structure 300. Specifically, the second capping layer 420 has a thickness less than 20 Å.

Each of the first and second capping layers 410, 420 have a band gap larger than that of each of the second potential barrier layers 301 and the electron barrier layer 500. The larger band gap of each of the first and second capping layers 410, 420 reduces the electron overflow and increases the hole injection effect.

The electron barrier layer 500 may be an aluminum nitrate-containing layer having an aluminum percentage between 2% and 25%. The electron barrier layer 500 may have a base layer made of a material with the formula of $Al_xIn_yGa_{1-x-y}N$, wherein $0.02<x<0.25$, and be doped with p-type impurity using ion implantation technique.

Figure 2:
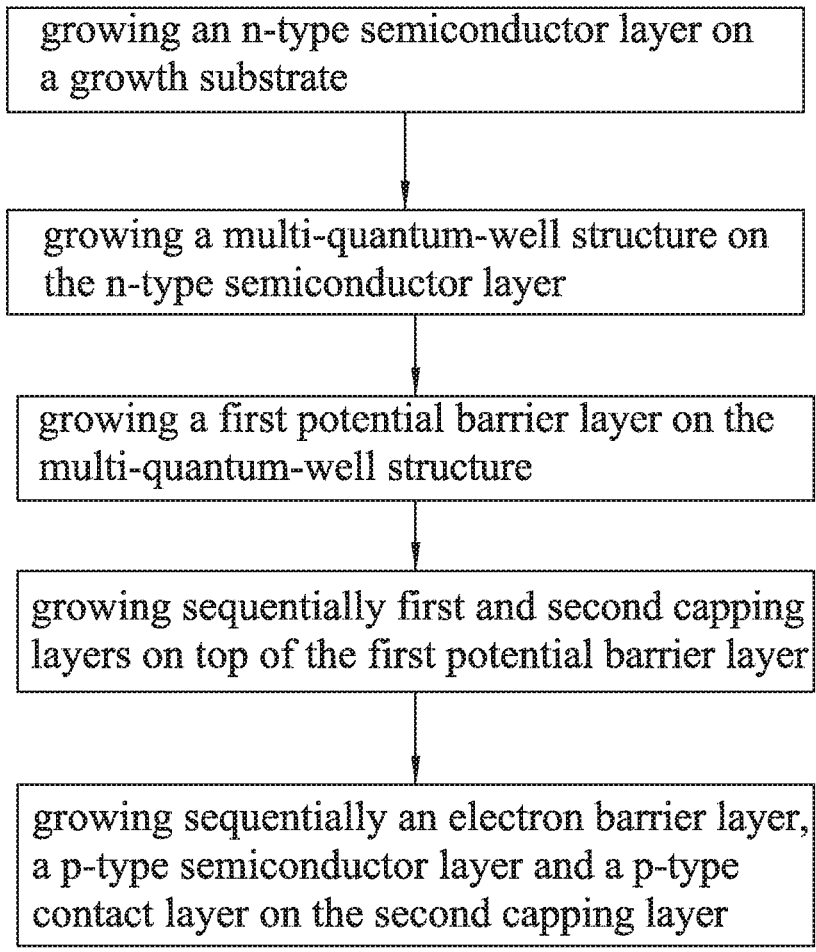
FIG. 2 is a process diagram of an embodiment of a method of preparing a semiconductor light emitting device according to the disclosure.

Referring to FIG. 2, an embodiment of a method of preparing the semiconductor light emitting device of FIG. 1 includes growing the n-type semiconductor layer 200 on the growth substrate 100, growing the multi-quantum-well structure 300 on the n-type semiconductor layer 200, growing the first potential barrier layer 310 on the multi-quantum-well structure 300, growing sequentially the first and second capping layers 410, 420 on top of the first potential barrier layer 310, and growing sequentially the electron barrier layer 500, the p-type semiconductor layer 600 and the p-type contact layer 700 on the second capping layer 420.

The n-type semiconductor layer 200, the multi-quantum-well structure 300, the first capping layer 410, the second capping layer 420, the electron barrier layer 500, the p-type semiconductor layer 600 and the p-type contact layer 700 are grown using epitaxial technique.

In certain embodiments, the method further includes growing the buffer layer 800 on the growth substrate 100 before growth of the n-type semiconductor layer 200.

The relatively low growth temperature of each of the first and second capping layers 410, 420 prevents lowering of the crystal quality of the multi-quantum-well structure 300 and spreading of the p-type impurity. However, the quality of the first and second capping layer 410, 420, especially the second capping layer 420 whose growth temperature is lower than that of each of the potential well layers 302, may be negatively affected by the lower growth temperature, and thus the second capping layer 420 has a thickness less than 20 Å. In certain embodiments, the thickness is between 2 Å to 10 Å.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A semiconductor light emitting device comprising:
a growth substrate; and
an n-type semiconductor layer, a multi-quantum-well structure, a first potential barrier layer, a first capping layer, a second capping layer, an electron barrier layer, a p-type semiconductor layer, and a p-type contact layer stacked in order on said growth substrate,
wherein said multi-quantum-well structure includes a plurality of alternately-stacked second potential barrier layers and potential well layers; and
wherein said first capping layer is an undoped semiconductor layer, said second capping layer being a p-doped semiconductor layer, each of said first and second capping layers having a band gap larger than that of each of said second potential barrier layers and said electron barrier layer.

2. The semiconductor light emitting device as claimed in claim 1, wherein said first capping layer is an undoped aluminum nitride layer and said second capping layer is a p-doped AlN layer.

3. The semiconductor light emitting device as claimed in claim 1, wherein said second capping layer has a thickness less than that of each of said potential well layers of said multi-quantum-well structure.

4. The semiconductor light emitting device as claimed in claim 1, wherein said second capping layer has a p-type doping concentration higher than that of said p-type semiconductor layer and lower than that of said p-type contact layer.

5. The semiconductor light emitting device as claimed in claim 1, wherein said second capping layer has a p-type doping concentration between $1 \times 10^{19}$ $cm^{-3}$ and $1 \times 10^{20}$ $cm^{-3}$.

6. The semiconductor light emitting device as claimed in claim 1, wherein said second capping layer has a thickness less than 20 Å.

7. The semiconductor light emitting device as claimed in claim 1, wherein said electron barrier layer is an aluminum nitrate-containing layer having an aluminum percentage between 2% and 25%.

8. The semiconductor light emitting device as claimed in claim 1, further comprising a buffer layer formed between said n-type semiconductor layer and said growth substrate, said buffer layer being made from a material selected from the group consisting of AlN, gallium nitride, aluminum gallium nitride, aluminum indium gallium nitride, indium nitride, indium gallium nitride and combinations thereof.

9. The semiconductor light emitting device as claimed in claim 1, wherein said first potential barrier layer is an undoped semiconductor layer having one of a single-layered structure and a multi-layered structure.

10. The semiconductor light emitting device as claimed in claim 1, wherein each of said second potential barrier layers is one of an undoped semiconductor layer and an n-doped semiconductor layer.

11. A method of preparing a semiconductor light emitting device, comprising:
grown an n-type semiconductor layer on a growth substrate;
growing a multi-quantum-well structure on the n-type semiconductor layer;
growing a first potential barrier layer on the multi-quantum-well structure;
growing sequentially first and second capping layers on top of the first potential barrier layer; and
growing sequentially an electron barrier layer, a p-type semiconductor layer and a p-type contact layer on the second capping layer,
wherein the multi-quantum-well structure including a plurality of alternately stacked second potential barrier layers and potential well layers;
wherein the first capping layer is an undoped layer having a growth temperature between that of the second potential barrier layers and that of the potential well layers, the second capping layer being a p-doped layer having a growth temperature lower than that of the potential well layers; and wherein each of the first and second capping layers having an band gap larger than that of each of the second potential barrier layers and the electron barrier layer.

12. The method as claimed in claim 11, wherein said second capping layer has a p-type doping concentration between $1\times10^{19}$ cm$^{-3}$ and $1\times10^{20}$ cm$^{-3}$.

13. The method as claimed in claim 11, wherein the n-type semiconductor layer, the multi-quantum-well structure, the first capping layer, the second capping layer, the electron barrier layer, the p-type semiconductor layer and the p-type contact layer are grown using epitaxial technique.

14. The method as claimed in claim 11, wherein each of the potential well layers has a growth temperature lower than that of each of the second potential barrier layers.

15. The method as claimed in claim 11, wherein the first potential barrier layer is an undoped layer having a growth temperature equal to that of each of the second potential barrier layers.

16. The method as claimed in claim 11, wherein the first capping layer is a u-AlN layer and the second capping layer is a p-AlN layer.

17. The method as claimed in claim 11, further comprising growing a buffer layer on the growth substrate before growth of the n-type semiconductor layer, the buffer layer being made from a material selected from the group consisting of AlN, GaN, AlGaN, AlInGaN, InN, InGaN and combinations thereof.

* * * * *